US012784952B2

(12) United States Patent
Fukagawa

(10) Patent No.: US 12,784,952 B2
(45) Date of Patent: Nov. 3, 2026

(54) MAGNETIC POWDER FOR RADIO WAVE ABSORBER AND MANUFACTURING METHOD THEREFOR, RADIO WAVE ABSORBER, RADIO WAVE ABSORBING ARTICLE, AND RADIO WAVE ABSORBING COMPOSITION

(71) Applicant: FUJIFILM Corporation, Tokyo (JP)

(72) Inventor: Kiyotaka Fukagawa, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 610 days.

(21) Appl. No.: 18/353,428

(22) Filed: Jul. 17, 2023

(65) Prior Publication Data

US 2023/0360828 A1 Nov. 9, 2023

Related U.S. Application Data

(63) Continuation of application No. PCT/JP2022/000860, filed on Jan. 13, 2022.

(30) Foreign Application Priority Data

Jan. 18, 2021 (JP) ................................ 2021-005750
Apr. 15, 2021 (JP) ................................ 2021-069081

(51) Int. Cl.

| | |
|---|---|
| ***H01F 1/34*** | (2006.01) |
| ***C01G 49/00*** | (2006.01) |
| ***H01F 1/37*** | (2006.01) |
| ***H01Q 17/00*** | (2006.01) |
| ***H05K 9/00*** | (2006.01) |

(52) U.S. Cl.

CPC ......... *H01F 1/344* (2013.01); *C01G 49/0045* (2013.01); *H01F 1/37* (2013.01); *H01Q 17/00* (2013.01); *H05K 9/0075* (2013.01); *C01P 2002/72* (2013.01); *C01P 2004/61* (2013.01); *C01P 2004/84* (2013.01); *C01P 2006/42* (2013.01)

(58) Field of Classification Search

CPC ........... H01F 1/37; H01F 1/344; H01Q 17/00; H05K 9/0075; C01G 49/0045; C01P 2002/72; C01P 2004/61; C01P 2004/84; C01P 2006/42

See application file for complete search history.

(56) References Cited

U.S. PATENT DOCUMENTS

| | | | | |
|---|---|---|---|---|
| 12,260,977 | B2 | 3/2025 | Hashimoto | |
| 2020/0335247 | A1 | 10/2020 | Hosoya et al. | |
| 2021/0166850 | A1 | 6/2021 | Hashimoto | |
| 2021/0166851 | A1 | 6/2021 | Hashimoto | |
| 2022/0148775 | A1 | 5/2022 | Yamaji et al. | |
| 2022/0376402 | A1* | 11/2022 | Hashimoto | H01F 1/348 |

FOREIGN PATENT DOCUMENTS

| | | | | |
|---|---|---|---|---|
| CN | 111527572 | A | 8/2020 | |
| DE | 3724379 | A1 | 2/1989 | |
| EP | 4 040 933 | A1 | 8/2022 | |
| EP | 4 175 438 | A1 | 5/2023 | |
| JP | 2007-250823 | * | 9/2007 | |
| JP | 2007-250823 | A | 9/2007 | |
| JP | 2020-123701 | A | 8/2020 | |
| JP | 2020-145340 | A | 9/2020 | |
| JP | 2020-184599 | A | 11/2020 | |
| WO | 2019/131675 | A1 | 7/2019 | |
| WO | 2019/235539 | A1 | 12/2019 | |
| WO | 2020/044649 | A1 | 3/2020 | |
| WO | 2020/044702 | A1 | 3/2020 | |
| WO | 2020/044706 | A1 | 3/2020 | |
| WO | 2020/188927 | A1 | 9/2020 | |
| WO | WO-2021065365 | A1 * | 4/2021 | H01F 1/348 |

OTHER PUBLICATIONS

Translation for JP 2007-250823, Sep. 27, 2007.*
Extended European Search Report issued Jun. 21, 2024 in European Application No. 22739444.2.
International Preliminary Report on Patentability (with translation of Written Opinion) dated Jul. 4, 2023 issued in International Application No. PCT/JP2022/000860.
International Search Report dated Mar. 8, 2022, issued in International Application No. PCT/JP2022/000860.
Written Opinion dated Mar. 8, 2023 in International Application No. PCT/JP2022/000860.
Communication dated Apr. 30, 2026, issued in Chinese Application No. 202280010492.5.

* cited by examiner

*Primary Examiner* — C Melissa Koslow
(74) *Attorney, Agent, or Firm* — Sughrue Mion, PLLC

(57) ABSTRACT

The magnetic powder for a radio wave absorber is a powder of a hexagonal ferrite having a composition represented by Formula 1, a region B is present on the particle surface of the powder, and Expression 2: 0.3≤content of A atom in region B/content of Al atom in region B≤23.0 and Expression 3: 1.2≤total of content of A atom and content of Al atom in region B/total of content of A atom and content of Al atom in entire powder≤2.5 are satisfied. The region B is a region that is observed as a bright region having a long side diameter of 0.1 μm to 0.6 μm in an image subjected to binarization processing. A represents one or more kinds of atoms (A atom) selected from the group consisting of Sr, Ba, Ca, and Pb, and x satisfies 0.10≤x≤5.00.

$$AFe_{(12-x)}Al_xO_{19} \quad \text{(Formula 1)}$$

14 Claims, No Drawings

MAGNETIC POWDER FOR RADIO WAVE ABSORBER AND MANUFACTURING METHOD THEREFOR, RADIO WAVE ABSORBER, RADIO WAVE ABSORBING ARTICLE, AND RADIO WAVE ABSORBING COMPOSITION

CROSS-REFERENCE TO RELATED APPLICATIONS

This application is a Continuation of PCT International Application No. PCT/JP2022/000860 filed on Jan. 13, 2022, which claims priority under 35 U.S.C. § 119(a) to Japanese Patent Application No. 2021-005750 filed on Jan. 18, 2021 and Japanese Patent Application No. 2021-069081 filed on Apr. 15, 2021. Each of the above applications is hereby expressly incorporated by reference, in its entirety, into the present application.

BACKGROUND OF THE INVENTION

1. Field of the Invention

The present invention relates to a magnetic powder for a radio wave absorber and a manufacturing method therefor, a radio wave absorber, a radio wave absorbing article, and a radio wave absorbing composition.

2. Description of the Related Art

A radio wave absorber containing a magnetic powder as the radio wave absorption material is known (see JP2007-250823A and JP2020-123701A).

SUMMARY OF THE INVENTION

In recent years, as an electronic device that uses radio waves, a radar for recognizing an object by transmitting and receiving radio waves has attracted attention. For example, an on-vehicle radar transmits radio waves and receives the radio waves reflected by an object (such as a pedestrian, a vehicle, or the like), whereby it can recognize the presence of the object, the distance to the object, or the like. In order to prevent collision with an object, as necessary, an automatic driving control system of an automobile can automatically brake and stop the automobile or can automatically control the speed to keep the distance to the object based on the results obtained by the radar recognizing the object.

In order to improve the reliability of the system that carries out various controls based on the results obtained by the radar recognizing the object as described above, it is desired to improve the performance of the radar. For this reason, in recent years, it has begun to be examined to install a radio wave absorber on the front side (an incident side of the radio wave incident from the outside) of the radio wave transmitting and receiving unit of the radar to improve the recognition accuracy.

It is desired that the radio wave absorber has excellent radio wave absorbability. From the viewpoint of improving the radio wave absorbability, it is desirable to improve the transmission attenuation characteristics of the radio wave absorber. Examples of the indicator of the transmission attenuation characteristics of the radio wave absorber include a transmission attenuation amount. From the viewpoint of improving the recognition accuracy of the radar, it is desirable to use a radio wave absorber that exhibits a high transmission attenuation amount at a frequency to be absorbed. In addition, also in various other use applications in which a radio wave absorber is used, a radio wave absorber exhibiting a high transmission attenuation amount at a frequency to be absorbed is desirable. Regarding this point, further improvement is desired in the radio wave absorber in the related art.

In consideration of the above circumstances, one aspect of the present invention is to provide a new magnetic powder for enabling the manufacture of a radio wave absorber having excellent transmission attenuation characteristics.

One aspect of the present invention relates to;

a magnetic powder for a radio wave absorber, in which the magnetic powder is a powder of a hexagonal ferrite, having a composition represented by Formula 1:

$$AFe_{(12-x)}Al_xO_{19} \quad \text{(Formula 1)}$$

(in Formula 1, A represents one or more kinds of atoms (referred to as an "A atom" in the present invention and the present specification) selected from the group consisting of Sr, Ba, Ca, and Pb, and x satisfies $0.10 \le x \le 5.00$), and a region B is present on a particle surface of the powder, and the magnetic powder satisfies a relational expression of Expression 2 and Expression 3:

$$0.3 \le \text{content of } A \text{ atom in region } B/\text{content of Al atom in region } B \le 23.0, \quad \text{(Expression 2)}$$

$$1.2 \le \text{total of content of } A \text{ atom and content of Al atom in region } B/\text{total of content of } A \text{ atom and content of Al atom in entire powder} \le 2.5. \quad \text{(Expression 3)}$$

The content is a content in which a total of an A atom, an Fe atom, and an Al atom is set to 100% by atom, and a unit of the content is % by atom. The region B is a region that is observed as a bright region having a long side diameter of 0.1 μm or more and 0.6 μm or less in an image subjected to binarization processing, which is obtained by subjecting an image obtained by imaging the particle surface with a scanning electron microscope (SEM), to the binarization processing.

In one form, the peak particle diameter of the magnetic powder for a radio wave absorber can be 4.5 μm or more and less than 12.0 μm.

In one form, in Formula 1, the A atom can be one or two kinds of atoms selected from the group consisting of Sr and Ba.

In one form, the magnetic powder for a radio wave absorber can further satisfy Expression 4. The following content is a content in which a total of an A atom, an Fe atom, and an Al atom is set to 100% by atom, and a unit of the following content is % by atom.

$$1.5 \le \text{content of } A \text{ atom in region } B/\text{content of Al atom in region } B \le 10.0 \quad \text{(Expression 4)}$$

In one form, the magnetic powder for a radio wave absorber can be a powder of a hexagonal ferrite in which a ratio ($\sigma s/\beta$) of a saturation magnetization $\sigma s$ to a half-width $\beta$ of a diffraction peak on a (107) plane is 240 $emu \cdot g^{-1} \cdot degree^{-1}$ or more, where the half-width $\beta$ is determined by X-ray diffraction analysis.

One aspect of the present invention relates to a radio wave absorber containing the magnetic powder for a radio wave absorber.

In one form, the radio wave absorber can further contain a binder.

One aspect of the present invention relates to a radio wave absorbing article including the radio wave absorber.

One aspect of the present invention relates to;

a manufacturing method for the magnetic powder for a radio wave absorber, which includes adding an adding amount of 3.0% by mass or more of one or more kinds of chlorides selected from the group consisting of strontium chloride, barium chloride, and hydrates thereof, to a mixture obtained by mixing a raw material of a hexagonal ferrite, with respect to 100% by mass of a total mass of the raw materials.

In one form, the adding amount of the chloride can be 5.0% by mass or more and 15.0% by mass or less.

In one form, the raw material can contain an Al compound having an average particle size of 100 μm or less.

One aspect of the present invention relates to a radio wave absorbing composition containing the magnetic powder for a radio wave absorber.

In one form, the radio wave absorbing composition can further contain a binder.

In one form, the radio wave absorbing composition can be a filament for a three-dimensional (3D) printer.

According to one aspect of the present invention, it is possible to provide a new magnetic powder (magnetic powder for a radio wave absorber) that enables the manufacture of a radio wave absorber having excellent transmission attenuation characteristics and to provide a manufacturing method for the magnetic powder. Further, according to one aspect of the present invention, it is possible to provide a radio wave absorber and a radio wave absorbing composition, which contains the magnetic powder for a radio wave absorber, and a radio wave absorbing article including the radio wave absorber.

DESCRIPTION OF THE PREFERRED EMBODIMENTS

[Magnetic Powder for Radio Wave Absorber]

Hereinafter, the magnetic powder for a radio wave absorber (hereinafter, also simply referred to as the "magnetic powder") will be described.

In the present invention and the present specification, the "radio wave" means an electromagnetic wave having a frequency of 3 terahertz (THz) or less. The "radio wave absorber" has radio wave absorbability. The radio wave absorbability can be evaluated, for example, by a transmission attenuation amount, the details of which will be described later. It can be said that the higher the value of the transmission attenuation amount is, the higher the transmission attenuation characteristics are, and the more excellent the radio wave absorbability is. The "magnetic powder for a radio wave absorber" is a magnetic powder that is used for the manufacture of a radio wave absorber and is contained in the manufactured radio wave absorber.

In the present invention and the present specification, the "powder" means an aggregation of a plurality of particles. The "aggregation" is not limited to a form in which particles that constitute an aggregation are in direct contact with each other, and also includes a form in which a binder described later or the like is interposed between the particles.

It can be confirmed by X-ray diffraction analysis that the magnetic powder is a powder of a hexagonal ferrite, as will be described later. The composition of the magnetic powder can be confirmed by subjecting a dissolution solution in which the magnetic powder is dissolved, to a high frequency inductively coupled plasma emission spectroscopic analysis. Specific examples of the checking method include a method described in Examples described later. Alternatively, after exposing a cross-section by cutting the radio wave absorber or the like, the exposed cross-section is subjected to, for example, energy dispersive X-ray analysis, whereby the composition of the magnetic powder contained in the radio wave absorber can be checked. In this way, it can be confirmed that the magnetic powder is a hexagonal ferrite having a composition represented by Formula 1.

A region B is present on the particle surface of the magnetic powder. In the present invention and the present specification, the fact that "the region B is present" on the particle surface of the magnetic powder shall be specified according to the following method by a scanning electron microscope (SEM) measurement.

(Acquisition of SEM Image and Creation of Image Subjected to Binarization Processing)

A magnetic powder to be measured is placed on a specimen support for SEM, and then platinum (Pt) is vapor-deposited on the magnetic powder on the specimen support. Pt vapor deposition can be carried out using an ion coater. As the ion coater, it is possible to use, for example, an ion coater EIKO 1B-5, manufactured by EIKO Corporation.

The specimen support on which the magnetic powder subjected to the Pt vapor deposition is placed is attached to the SEM, the acceleration voltage is set to 5 kV, a magnification is set to 10,000 times, and an SEM image of the magnetic powder is captured in a randomly selected region. As the SEM, it is possible to use a field emission-scanning electron microscope (FE-SEM). As the FE-SEM, it is possible to use, for example, FE-SEM SU 8220, manufactured by Hitachi High-Tech Corporation. An SEM image is acquired as a secondary electron image.

Then, the obtained SEM image is incorporated into image processing software and subjected to binarization processing. The binarization processing can be carried out using ImageJ, which is free software, as the image processing software. The binarization processing can be carried out by setting the binarization processing condition of ImageJ to 8-bit and setting the default condition of the threshold value to AUTO. In this way, an image subjected to binarization processing, in which the SEM image is divided into a bright region (a white portion) and a dark region (a black portion), is obtained.

(Specification of Presence of Region B)

For each bright region (white portion) included in the randomly selected region having a size of "10 μm×8 μm" obtained above, which has been subjected to the binarization processing, a rectangle having a size that accommodates the entire bright region is determined, where each of the four sides of the rectangle is in contact with the contour portion of the bright region. Such a rectangle can be visually determined by an operator, and in Examples described later, an operator visually determines such a rectangle. The length of the long side of this rectangle shall be referred to as the long side diameter of the bright region. In a case where the determined rectangle is a square in which the length of the long side and the length of the short side are equal, the length of one side of the square shall be defined as the long side diameter. In a case where five or more bright regions having a long side diameter of 0.1 μm or more and 0.6 μm or less are confirmed in the region having a size of "10 μm×8 μm" described above, it shall be determined that the region B is present on the particle surface. The reason for setting five regions as the threshold value is to reduce or eliminate the influence of the error factor. The region B is speculated to be a minute protrusion or a minute attachment on the particle surface of the magnetic powder. However, the present invention is not limited to the speculation described in the present specification. In a plurality of bright regions having a long side diameter of 0.1 μm or more and 0.6 μm or less, which are included in the region having a size of "10 μm×8 μm" described above, an arithmetic mean of the long side diameters can be 0.1 μm or more and 0.6 μm or less and can also be 0.2 μm or more and 0.5 μm or less.

The magnetic powder satisfies the relational expressions of Expression 2 and Expression 3. The composition analysis for determining that these relational expressions are satisfied is carried out according to the following method.

(Composition Analysis)

The composition of the region B and the composition of the entire powder, which relate to Expression 2 and Expression 3, are specified by subjecting the same region as the region in which the specification of the presence of the region B has been carried out, to an energy dispersive X-ray spectroscopy (EDS) measurement.

Specifically, an image is obtained with an EDS apparatus, for the region having a size of "10 μm×8 μm" in which the presence of the region B has been specified. In the obtained image, quantification operations for the A atom, the Fe atom, and the Al atom are carried out on the entire image and the rectangular portion surrounding the bright region. Each of amounts of the various atoms in the region B is obtained as the total amount in the portions of the plurality of rectangles. From the quantification results obtained in this way, the "content of A atom in region B" which relates to Expression 2 and Expression 3 is calculated as a content of the A atom quantified in the region B with respect to the total (100% by atom) of the A atom, the Fe atom, and the Al atom, which have been quantified in the region B. The "content of Al atom in region B" which relates to Expression 2 and Expression 3 is calculated as a content of the Al atom quantified in the region B with respect to the total (100% by atom) of the A atom, the Fe atom, and the Al atom, which have been quantified in the region B. The "content of A atom in entire powder" which relates to Expression 3 is calculated as a content of the A atom quantified in the entire image with respect to the total (100% by atom) of the A atom, the Fe atom, and the Al atom, which have been quantified in the entire image (that is, the image obtained in the region having a size of "10 μm×8 μm" described above). The "content of Al atom in entire powder" which relates to Expression 3 is calculated as a content of the Al atom quantified in the entire image with respect to the total (100% by atom) of the A atom, the Fe atom, and the Al atom, which have been quantified in the entire image.

The inventors of the present invention conceive that the fact that the magnetic powder having the composition represented by Formula 1 satisfies the relational expression of Expression 2 indicates that the abundance of the A atom with respect to the Al atom in the region B is relatively large, and the fact that it satisfies the relational expression of Expression 3 indicates that the proportions of the A atom and the Al atom in the region B are large as compared with the proportion of the entire powder. As a result of repeated diligent studies, the inventors of the present invention newly found that the fact that the magnetic powder having the composition represented by Formula 1 has the region B present on the particle surface of the magnetic powder and satisfies the relational expressions of Expression 2 and Expression 3 regarding the compositions of the region B and the entire powder can contribute to the ability of the radio wave absorber containing this magnetic powder to exhibit excellent transmission attenuation characteristics.

Hereinafter, the magnetic powder will be described in more detail.

<Powder of Hexagonal Ferrite>

The magnetic powder is a powder of a hexagonal ferrite having a composition represented by Formula 1. The kind of the magnetic material that constitutes the magnetic powder contained in the radio wave absorber can be checked by extracting the magnetic powder from the radio wave absorber according to a known method and carrying out an analysis according to the X-ray diffraction method on the extracted magnetic powder. The extraction of the magnetic powder from the radio wave absorber can be carried out, for example, by finely chopping a part or entire radio wave absorber, immersing it in a solvent (for example, hexafluoroisopropanol) for 1 to 2 days, and then separately filtering and drying the magnetic powder portion. It is also possible to promote the dissolution of a component such as a binder in a solvent by appropriately carrying out stirring and/or heating in the solvent instead of the immersion or in addition to the immersion in the solvent. For example, it is possible to check the kind of the magnetic material that constitutes the magnetic powder by further grinding the dried magnetic material finely and subjecting it to an analysis according to the X-ray diffraction method.

In the present invention and the present specification, the "powder of a hexagonal ferrite" refers to a magnetic powder in which a hexagonal ferrite-type crystal structure is detected as the main phase by an analysis according to the X-ray diffraction method. The main phase refers to a structure to which the highest intensity diffraction peak attributes in the X-ray diffraction spectrum are obtained according to the X-ray diffraction method. For example, in a case where the highest intensity diffraction peak in the X-ray diffraction spectrum obtained according to the X-ray diffraction method attributes to the hexagonal ferrite-type crystal structure, it is determined that the hexagonal ferrite-type crystal structure is detected as the main phase. In a case where only a single structure is detected according to the X-ray diffraction method, this detected structure is used as the main phase.

<Formula 1>

The so-called unsubstitution-type hexagonal ferrite which does not contain a substituent atom that substitutes for an iron atom contains an iron atom, a divalent metal atom, and an oxygen atom, as constituent atoms of the hexagonal ferrite. The divalent metal atom is a metal atom that is capable of being a divalent cation, as an ion, and examples thereof include an alkaline earth metal atom such as a strontium atom, a barium atom, or a calcium atom, and a lead atom. On the other hand, the hexagonal ferrite having the composition represented by Formula 1 can be said to be a substitution-type magnetoplumbite-type hexagonal ferrite in which a part of iron atoms of the magnetoplumbite-type hexagonal ferrite are substituted with an aluminum atom.

$$AFe_{(12-x)}Al_xO_{19} \quad \text{(Formula 1)}$$

(In Formula 1, A represents one or more kinds of atoms selected from the group consisting of Sr, Ba, Ca, and Pb, and x satisfies $0.10 \le x \le 5.00$.)

Hereinafter, Formula 1 will be described in more detail.

In Formula 1, A represents one or more kinds of atoms (hereinafter, an "A atom") selected from the group consisting of Sr, Ba, Ca, and Pb, it may be only one kind of atom, it may contain two or more kinds of atoms in any ratio, and, from the viewpoint of improving the uniformity of the composition between particles that constitute the powder, it is preferably only one kind of atom or only two kinds of atoms, and more preferably one kind of atom.

From the viewpoint of the transmission attenuation characteristics in the high frequency band, A in Formula 1 is preferably one or more kinds of atoms selected from the group consisting of Sr, Ba, and Ca, more preferably one or more kinds of atoms selected from the group consisting of Sr and Ba, and still more preferably only Sr or only Ba. In the present invention and the present specification, the fact that A in Formula 1 is only Sr shall mean that in a case where the total of the A atom (that is, the total of Sr, Ba, Ca, and Pb) is set to 100% by atom in the composition confirmed according to the method described above, the content of Sr is 95% by atom or more. The fact that A in Formula 1 is only Ba shall mean that in a case where the total of the A atom (that is, the total of Sr, Ba, Ca, and Pb) is set to 100% by atom in the composition confirmed according to the method described above, the content of Ba is 95% by atom or more.

In Formula 1, x satisfies $0.10 \leq x \leq 5.00$.

x is 0.10 or more from the viewpoint of improving the transmission attenuation characteristics, and it is more preferably 0.40 or more from the viewpoint of further improving the transmission attenuation characteristics. In addition, x is 5.00 or less from the viewpoint of magnetic properties, and it is preferably 4.50 or less, more preferably 4.00 or less, still more preferably 3.50 or less, and even still more preferably 3.00 or less, from the viewpoint of further improving the transmission attenuation characteristics.

Specific examples of the composition represented by Formula 1 include $SrFe_{(9.58)}Al_{(2.42)}O_{19}$, $SrFe_{(9.37)}Al_{(2.63)}O_{19}$, $SrFe_{(9.27)}Al_{(2.73)}O_{19}$, $SrFe_{(9.85)}Al_{(2.15)}O_{19}$, $SrFe_{(10.00)}Al_{(2.00)}O_{19}$, $SrFe_{(9.74)}Al_{(2.26)}O_{19}$, $SrFe_{(10.44)}Al_{(1.56)}O_{19}$, $SrFe_{(9.79)}Al_{(2.21)}O_{19}$, $SrFe_{(9.33)}Al_{(2.67)}O_{19}$, $SrFe_{(7.88)}Al_{(4.12)}O_{19}$, $SrFe_{(7.04)}Al_{(4.96)}O_{19}$, $SrFe_{(7.37)}Al_{(4.63)}O_{19}$, $SrFe_{(7.71)}Al_{(4.29)}O_{19}$, $Sr_{(0.80)}Ba_{(0.10)}Ca_{(0.10)}Fe_{(9.83)}Al_{(2.17)}O_{19}$, $BaFe_{(9.50)}Al_{(2.50)}O_{19}$, $CaFe_{(10.00)}Al_{(2.00)}O_{19}$, and $PbFe_{(9.00)}Al_{(3.00)}O_{19}$. In addition, specific examples thereof also include the composition shown in Table 1 described later.

In one form, in the powder of the hexagonal ferrite, the crystal phase can be a single phase, and a plurality of crystal phases can be included. It is preferable that the crystal phase is a single phase, and it is more preferable that the powder of the hexagonal ferrite is a powder of a magnetoplumbite-type hexagonal ferrite in which the crystal phase is a single phase.

The case where the "crystal phase is a single phase" refers to a case where only one kind of diffraction pattern showing any crystal structure is observed in an analysis carried out according to the X-ray diffraction method. The analysis according to the X-ray diffraction method can be carried out, for example, according to the method described in Examples described later. In a case where a plurality of crystal phases are included, two or more kinds of diffraction patterns showing any crystal structure are observed in the analysis according to the X-ray diffraction method. Regarding the attribution of the diffraction pattern, for example, a database of the International Centre for Diffraction Data (ICDD, registered trade name) can be referenced. For example, regarding the diffraction pattern of the magnetoplumbite-type hexagonal ferrite containing Sr, "00-033-1340" of the International Centre for Diffraction Data (ICDD) can be referred to. However, in a case where a part of iron atoms are substituted with a substituent atom such as an aluminum atom, the peak position shifts from the peak position in a case where the substituent atom is not included.

<Expression 2 and Expression 3>

The magnetic powder satisfies the relational expressions of Expression 2 and Expression 3 below. The inventors of the present invention conceive that this is the reason why the radio wave absorber containing the magnetic powder can exhibit excellent transmission attenuation characteristics.

$$0.3 \leq \text{content of } A \text{ atom in region } B/\text{content of Al atom in region } B \leq 23.0 \quad \text{(Expression 2)}$$

$$1.2 \leq \text{total of content of } A \text{ atom and content of Al atom in region } B/\text{total of content of } A \text{ atom and content of Al atom in entire powder} \leq 2.5 \quad \text{(Expression 3)}$$

From the viewpoint of further improving the transmission attenuation characteristics, Expression 4 can be mentioned as a preferred form of Expression 2.

$$1.5 \leq \text{content of } A \text{ atom in region } B/\text{content of Al atom in region } B \leq 10.0 \quad \text{(Expression 4)}$$

Specific examples of the manufacturing method for a magnetic powder will be described later, where the magnetic powder is a magnetic powder having the composition represented by Formula 1, which has the region B present on the particle surface of the magnetic powder and satisfies the relational expressions of Expression 2 and Expression 3 regarding the compositions of the region B and the entire powder.

<Peak Particle Diameter>

Regarding the particle size of the magnetic powder, in the present invention and the present specification, the mode diameter which is the most frequent value in the volume-based particle size distribution measured according to the laser diffraction and scattering method shall be referred to as a "peak particle diameter". The peak particle diameter of the magnetic powder is preferably 4.5 μm or more. A magnetic powder having a peak particle diameter of 4.5 μm or more has a relatively small number of fine particles. Therefore, in a case of using such a magnetic powder, there is a tendency that a radio wave absorber having more excellent radio wave absorption performance can be manufactured. From this point of view, the peak particle diameter of the magnetic powder is preferably 4.8 μm or more and more preferably 5.0 μm or more. On the other hand, the peak particle diameter of the magnetic powder is preferably less than 12.0 μm. A magnetic powder having a peak particle diameter of less than 12.0 μm has a relatively small number of coarse particles. Therefore, in a case of using such a magnetic powder, there is a tendency that a radio wave absorber having higher strength can be manufactured. From this point of view, the peak particle diameter of the magnetic powder is preferably 11.5 μm or less, more preferably 11.0 μm or less, still more preferably 10.0 μm or less, and even still more preferably 9.0 μm or less.

The peak particle diameter of the magnetic powder can be controlled by carrying out, for example, classification with a sieve, a centrifuge, or the like, or pulverization with a mortar and pestle, an ultrasonic disperser, or the like. For example, in a case of being controlled by pulverization, the particle diameter of the magnetic powder can be adjusted by selecting the pulverizing unit, the pulverizing time, the medium material, the medium diameter, or the like. For example, as the pulverizing time becomes long, the particle diameter of the magnetic powder tends to be small. Further, for example, as the medium diameter becomes small, the particle diameter of the magnetic powder tends to be small.

The peak particle diameter (the mode diameter) of the magnetic powder are values determined based on the volume-based particle size distribution measured by the laser diffraction and scattering method. The measurement of such a particle size distribution can be carried out according to a dry-type laser diffraction and scattering method, and it is carried out according to the following method in Examples described later. The above description can be referenced for the method of extracting the magnetic powder from the radio wave absorber.

Using a laser diffraction/scattering-type particle size distribution analyzer (Partica LA-960) manufactured by HORIBA, Ltd. as a measuring device, the magnetic powder is charged into a measurement holder so that the transmittance displayed on the measurement monitor of the device is 95% to 98%, and the particle size distribution is measured according to a laser diffraction and scattering method under a compressed air pressure condition of 0.40 MPa.

The shape of the particle that constitutes the magnetic powder is not particularly limited, and examples thereof include a spherical shape, a rod shape, a needle shape, a plate shape, and an irregular shape.

<Ratio (σs/β)>

In one form, the magnetic powder can be a powder of a hexagonal ferrite in which a ratio (σs/β) of a saturation magnetization σs to a half-width β of a diffraction peak on a (107) plane is 240 emu·g$^{-1}$·degree$^{-1}$ or more, where the half-width β is determined by X-ray diffraction analysis. It is preferable that the ratio (σs/β) is 240 emu·g$^{-1}$·degree$^{-1}$ or more from the viewpoint that a radio wave absorber capable of exhibiting still more excellent radio wave absorption performance can be provided.

The saturation magnetization σs is also called mass magnetization, and the unit thereof is emu/g. 1 emu/g is 1 A·m$^2$/kg. The saturation magnetization σs of the magnetic powder shall be a value measured using an oscillating sample magnetometer in an ambient air atmosphere of an ambient temperature of 23° C. and under conditions of a maximum applied magnetic field of 50 kOe and a magnetic field sweep rate of 25 Oe/s. 1 [kOe] is $10^6/4\sigma$ [A/m].

The β is the half-width of the diffraction peak on the (107) plane, which is determined by X-ray diffraction analysis of the powder of the hexagonal ferrite. The half-width is the full width at half maximum (FWHM). In the present invention and the present specification, the X-ray diffraction analysis for determining the ratio (σs/β) shall be carried out using a powder X-ray diffractometer under the following measurement conditions. An X-ray diffraction spectrum is obtained as a spectrum having a vertical axis: intensity (unit: count) and a horizontal axis: diffraction angle (unit: degree (°)). In the X-ray diffraction spectrum, the diffraction peak on the (107) plane is detected as a peak having an apex at a position where the diffraction angle 2θ is in a range of 32 to 33 degrees (generally, near 32.5 degrees). The half-width of the diffraction peak on the (107) plane can be determined by an analysis software installed in the powder X-ray diffractometer or by a known calculation method.

—Measurement Conditions—

X-ray source: CuKα ray

[Wavelength: 1.54 Å (0.154 nm), output: 40 mA, 45 kV]

Scan range: 25 degrees$<2\theta<$35 degrees

Scan interval: 0.05 degrees

Scan speed: 0.33 degrees/min

The saturation magnetization σs is one of the magnetic properties of the magnetic powder. On the other hand, the inventors of the present invention speculate that the β can be reduced by reducing the variation in the ferrite composition among the particles that constitute the powder of the hexagonal ferrite. Regarding the ratio (σs/β), examples of one means for increasing this value include making a value of the half-width β of the diffraction peak on the (107) plane, which is determined by X-ray diffraction analysis of the powder of the hexagonal ferrite, smaller. In addition, examples of one means for increasing the value of σs/β include increasing the as of the powder of the hexagonal ferrite.

In one form, the ratio (σs/β) is preferably 242 emu·g$^{-1}$·degree$^{-1}$ or more, more preferably 245 emu·g$^{-1}$·degree$^{-1}$ or more, still more preferably 247 emu·g$^{-1}$·degree$^{-1}$ or more, even more preferably 250 emu·g$^{-1}$·degree$^{-1}$ or more, even still more preferably 255 emu·g$^{-1}$·degree$^{-1}$ or more, and even further still more preferably 260 emu·g$^{-1}$·degree$^{-1}$ or more. In addition, the ratio (σs/β) can be, for example, 320 emu·g$^{-1}$·degree$^{-1}$ or less, 315 emu·g$^{-1}$·degree$^{-1}$ or less, or 310 emu·g$^{-1}$·degree$^{-1}$ or less. Alternatively, the ratio (σs/β) may be a value exceeding the value exemplified above.

In addition, in one form, the σs/β of the powder of the hexagonal ferrite is preferably 300 emu·g$^{-1}$·degree$^{-1}$ or more. In this form, the ratio (σs/β) is more preferably 300 emu·g$^{-1}$·degree$^{-1}$ or more and 400 emu·g$^{-1}$·degree$^{-1}$ or less.

<Manufacturing Method for Powder of Hexagonal Ferrite>

Examples of the manufacturing method for a powder of a hexagonal ferrite include a solid phase method and a liquid phase method. The solid phase method is a manufacturing method for a powder of a hexagonal ferrite by sintering a mixture obtained by mixing a plurality of solid raw materials. On the other hand, the liquid phase method includes a step of using a solution. The powder of the hexagonal ferrite can be manufactured according to a solid phase method or a liquid phase method. The powder of the hexagonal ferrite, which has been manufactured according to the solid phase method, can be easily distinguished from the powder of the hexagonal ferrite, which has been manufactured according to the liquid phase method. For example, the powder of the hexagonal ferrite, which has been manufactured according to the liquid phase method, is generally subjected to scanning electron microscope-energy dispersive X-ray spectroscopy (SEM-EDX) analysis due to the manufacturing method thereof, whereby precipitates of alkali metal salts can be confirmed on the surface of particles that constitute the powder. In addition, for example, in a case where the powder of the hexagonal ferrite, which has been manufactured according to the solid phase method, is subjected to the morphological observation of particles by using a field emission-scanning electron microscope (FE-SEM), so-called amorphous particles can be usually confirmed. For example, as described above, the powder of the hexagonal ferrite, which has been manufactured according to the solid phase method, can be easily distinguished from the powder of the hexagonal ferrite, which has been manufactured according to the liquid phase method. In one form, from the viewpoint of mass productivity, the powder of the hexagonal ferrite is preferably a powder of the hexagonal ferrite, which has been manufactured according to the solid phase method.

Examples of the raw material of the hexagonal ferrite having the composition represented by Formula 1 to be used in the solid phase method include an Fe compound, a compound of the A atom, and an Al compound. These compounds can be an oxide, a carbonate, or the like.

The inventors of the present invention conceive that the use of a powder of an aluminum (Al) compound having a small average particle size as the Al compound to be used as the raw material can contribute to the presence of the region B on the particle surface of the powder and the satisfaction of the relational expressions represented by Expression 2 and Expression 3. From this point of view, the average particle size of the powder of the Al compound is preferably 100 μm or less, and the average particle size thereof is more preferably 80 μm or less, still more preferably 50 μm or less, even more preferably 10 μm or less, even still more preferably 2 μm or less, and even further still more preferably 100 nm or less. In addition, the average particle size can be, for example, 10 nm or more or 20 nm or more.

In the present invention and the present specification, the average particle size of the Al compound is a median diameter D50 that is obtained based on a volume-based particle size distribution measured according to a laser diffraction and scattering method. D50 is a particle diameter that is 50% of the cumulative volume. The measurement of the particle size distribution can be carried out by a dry-type laser diffraction and scattering method, and it is carried out according to the following method in Examples described later.

Using a laser diffraction/scattering-type particle size distribution analyzer (Partica LA-960) manufactured by HORIBA, Ltd. as a measuring device, the powder of Al compound is charged into a measurement holder so that the transmittance displayed on the measurement monitor of the device is 95% to 98%, and the particle size distribution is measured according to a laser diffraction and scattering method under a compressed air pressure condition of 0.40 MPa.

The mixing ratio between a plurality of raw materials may be determined according to the desired hexagonal ferrite composition. A raw material mixture can be obtained by mixing a plurality of raw materials at the same time or sequentially mixing them in any order, and stirring the resultant mixture. The stirring of the raw materials can be carried out by a commercially available stirring device or a stirring device having a known configuration. As an example, the rotation speed during stirring can be set in a range of 300 to 3,000 revolutions per minute (rpm), and the stirring time can be set in a range of 10 minutes to 90 minutes. However, the rotation speed and the stirring time during stirring may be set according to the configuration of the stirring device to be used, and they are not limited to the range exemplified above. In addition, mixing and/or stirring of raw materials is not limited to being carried out under dry conditions. Under wet conditions, for example, a solvent such as water may be added, and mixing and/or stirring may be carried out in a slurry state. The above mixing and stirring can be carried out, for example, in an ambient air atmosphere at room temperature. In the present invention and the present specification, the "room temperature" means a temperature in a range of 20° C. to 27° C. unless otherwise specified.

After the above stirring, the obtained raw material mixture can be sintered. In this sintering, the crystallization of the raw material mixture can be promoted, whereby the crystal structure of the hexagonal ferrite can be formed. Regarding the sintering conditions, the sintering temperature can be set, for example, in a range of 1,000° C. to 1,500° C. The sintering temperature can be, for example, the ambient temperature inside the device in which sintering is carried out (for example, the temperature inside the heating furnace). The sintering time can be in a range of 1 hour to 6 hours. However, the above ranges are described as examples, and the sintering may be carried out under conditions under which the crystal structure of the hexagonal ferrite is capable of being formed. The sintering can be carried out, for example, in an ambient air atmosphere.

It is also possible to carry out sintering after adding a component (hereinafter, described as "flux") capable of functioning as a flux (a fusing agent) to the raw material mixture before sintering. Examples of the flux include $SrCl_2$, $BaCl_2$, $CaCl_2$, $MgCl_2$, KCl, NaCl, $BaCl_2 \cdot 2H_2O$, $Na_2B_4O_7$, and hydrates thereof. Examples of the hydrate include $SrCl_2 \cdot 6H_2O$, $BaCl_2 \cdot 2H_2O$, and $CaCl_2 \cdot 2H_2O$. Among them, from the viewpoint of making it possible to easily obtain the magnetic powder which has the region B present on the particle surface of the powder and satisfies the relational expressions represented by Expression 2 and Expression 3, one or more chlorides selected from the group consisting of strontium chloride ($SrCl_2$), barium chloride ($BaCl_2$), and hydrates thereof (for example, $SrCl_2 \cdot 6H_2O$ and $BaCl_2 \cdot 2H_2O$,) are preferable. More preferably, an adding amount of 3.0% by mass or more of the chloride can be added to a mixture obtained by mixing a raw material of a hexagonal ferrite, with respect to 100% by mass of a total mass of the raw materials. The adding amount can be, for example, 5.0% by mass or more or 10.0% by mass or more. In addition, the adding amount can be, for example, 30.0% by mass or less, and it is preferably 25.0% by mass or less, more preferably 20.0% by mass or less, and still more preferably 15.0% by mass or less. Regarding the hydrate, the adding amount shall be calculated based on the mass as the hydrate (the mass including the hydrated water). In one form, it is preferable to use a flux containing the same kind of A atom as that in the compound of the A atom to be used as a raw material of a hexagonal ferrite from the viewpoint of obtaining a magnetic powder having higher composition homogeneity. It is preferable that the composition of the magnetic powder has high homogeneity from the viewpoint of further improving the radio wave absorption performance. For example, in a case where the compound of the A atom is a compound of the Sr atom, a flux selected from the group consisting of strontium chloride and a hydrate thereof can be used as the flux, and in a case where the compound of the A atom is a compound of the Ba atom, a flux selected from the group consisting of barium chloride and a hydrate thereof can be used as the flux.

The raw material mixture before sintering can be subjected to a pulverization step, and/or the sintered product after the sintering can be subjected to a pulverization step. In a case of carrying out the pulverization step, it is possible to adjust the size of the particles that constitute the powder of the hexagonal ferrite. The pulverization can be carried out with a known pulverizing unit such as a mortar and pestle or a pulverizer (a cutter mill, a ball mill, a bead mill, a roller mill, a jet mill, a hammer mill, an attritor, or the like).

A known step can be optionally carried out before and/or after the various steps described above. Examples of such a step include various known steps such as washing and drying.

[Radio Wave Absorbing Composition and Radio Wave Absorber]

One aspect of the present invention relates to a radio wave absorber containing the magnetic powder.

In addition, one aspect of the present invention relates to a radio wave absorbing composition containing the magnetic powder.

<Magnetic Powder>

Details of the magnetic powder contained in each of the radio wave absorber and the radio wave absorbing composition are as described above.

(Volume Filling Rate of Magnetic Powder)

In the radio wave absorber and the radio wave absorbing composition, the filling rate of the magnetic powder is not particularly limited. For example, in one form, the filling rate can be 35% by volume or less and can be also in a range of 15% to 35% by volume in terms of the volume filling rate. In addition, in another form, the volume filling rate can be 35% by volume or more. In this case, the volume filling rate can be, for example, in a range of 35% to 60% by volume, and it can also be in a range of 35% to 50% by volume.

Regarding the radio wave absorber, the volume filling rate described above means a volume-based content with respect to the total volume (100% by volume) of the radio wave absorber. Regarding the radio wave absorbing composition, the volume filling rate means a volume-based content of solid contents (that is, components excluding the solvent) with respect to the total volume (100% by volume) of the radio wave absorber.

For example, the magnetic powder is collected from the radio wave absorber by a known method, and the volume filling rate of the magnetic powder in the radio wave absorber can be determined as "(the volume of the collected magnetic powder/the total volume of the radio wave absorber)×100". Here, the total volume of the radio wave absorber and the volume of the magnetic powder can be determined by a known method. Alternatively, in a case where the composition of the radio wave absorbing composition used for preparing a radio wave absorber is known, the volume filling rate of the magnetic powder in the radio wave absorber can be determined from this known composition.

In addition, the volume filling rate of the magnetic powder in the radio wave absorber can also be determined by the following method using a cross-section SEM image acquired by a scanning electron microscope (SEM).

A measurement sample having a square plane, one side of which has a length of 5 mm, is cut out from a randomly determined position of the radio wave absorber to be measured. A sample for cross-section observation is prepared from the cut-out sample. The sample for cross-section observation is prepared by focused ion beam (FIB) processing. The prepared cross-section observation sample is observed by SEM, and a cross-section image (SEM image) is captured. As the SEM, a field emission-scanning electron microscope (FE-SEM) is used. Using the FE-SEM, a cross-section observation sample is set on a stage so that the FIB-processed cross-section faces upward, and a cross-section SEM image with a visual field of 30 μm×40 μm is obtained under the conditions of an acceleration voltage of 15 kV and an observation magnification of 3,000 folds. The obtained cross-section SEM image is subjected to binarization processing, and the proportion (in terms of the area) of the magnetic powder is calculated.

The above operation is carried out on five measurement samples cut out from different positions of the radio wave absorber to be measured, and the volume filling rate of the magnetic powder can be determined as the arithmetic mean of the obtained five values. As necessary, the elemental analysis of the cross-section observation sample is carried out to specify the portion of the magnetic powder in the cross-section SEM image.

The volume filling rates of the other components described in the present specification can also be determined in the same manner as described above.

<Binder>

The radio wave absorber and the radio wave absorbing composition contain the magnetic powder and can further contain a binder. The binder can be, for example, a resin, and examples of the resin include a thermoplastic resin and a thermosetting resin.

Examples of the thermoplastic resin include an acrylic resin, polyacetal, polyamide, polyethylene, polypropylene, polyethylene terephthalate, polybutylene terephthalate, a polyethylene terephthalate-1,4-cyclohexanedimethanol terephthalate copolymer, polylactic acid, polycarbonate, polystyrene, polyphenylene sulfide, polyvinyl chloride, an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Examples of the thermosetting resin include a phenol resin, an epoxy resin, a melamine resin, a urea resin, an unsaturated polyester, a diallyl phthalate resin, a urethane resin, and a silicon resin.

The binder can also be rubber. From viewpoints that the mixability with the magnetic powder is good and the radio wave absorber having more excellent durability, weather fastness, and impact resistance can be manufactured, examples of the rubber include butadiene rubber, isoprene rubber, chloroprene rubber, halogenated butyl rubber, fluororubber, urethane rubber, acrylic rubber (abbreviation: ACM) obtained by copolymerization of an acrylic acid ester (for example, ethyl acrylate, butyl acrylate, or 2-ethylhexyl acrylate) and another monomer, ethylene-propylene rubber obtained by coordination polymerization of ethylene and propylene using a Ziegler catalyst, butyl rubber (abbreviation: IIR) obtained by copolymerization of isobutylene and isoprene, styrene butadiene rubber (abbreviation: SBR) obtained by copolymerization of butadiene and styrene, acrylonitrile butadiene rubber (abbreviation: NBR) obtained by copolymerization of acrylonitrile and butadiene, and silicone rubber.

In a case where the radio wave absorber of the present disclosure contains rubber as the binder, it may contain various additives such as a vulcanizing agent, a vulcanization aid, a softener, and a plasticizer, in addition to the rubber. Examples of the vulcanizing agent include sulfur, an organic sulfur compound, and a metal oxide.

Examples of the binder include a thermoplastic elastomer (TPE). Examples of the thermoplastic elastomer include an olefin-based thermoplastic elastomer (a thermoplastic olefinic elastomer (TPO)), a styrene-based thermoplastic elastomer (a thermoplastic styrenic elastomer (TPS)), an amide-based thermoplastic elastomer (a thermoplastic polyamide elastomer (TPA), and a polyester-based thermoplastic elastomer (a thermoplastic copolyester (TPC)).

The radio wave absorber and the radio wave absorbing composition may include only one kind of binder and may include two or more kinds thereof. The volume filling rate of the binder in the radio wave absorber and the radio wave absorbing composition is not particularly limited, and it is, for example, preferably 65% by volume or more, more preferably 65% by volume or more and 92% by volume or less, and still more preferably 65% by volume or more and 85% by volume or less. In a case where the radio wave absorber and the radio wave absorbing composition contain two or more kinds of binders, the volume filling rate means the total volume filling rate of the two or more kinds of binders. This point also identically applies to the volume filling rates of other components.

<Additive>

The radio wave absorber and the radio wave absorbing composition may randomly contain or may not contain one or more additives in any proportion. Examples of the additive include an antioxidant, a light stabilizer, a dispersing agent, a dispersing aid, a fungicide, an antistatic agent, a plasticizer, an impact resistance improver, a crystal nucleating agent, a lubricant, a surfactant, a pigment, a dye, a filler, a mold release agent (fatty acid, a fatty acid metal salt, an oxyfatty acid, a fatty acid ester, an aliphatic partially saponified ester, paraffin, a low molecular weight polyolefin, a fatty acid amide, an alkylenebis fatty acid amide, an aliphatic ketone, a fatty acid lower alcohol ester, a fatty acid polyhydric alcohol ester, a fatty acid polyglycol ester, a modified silicone, and the like), a processing aid, an anti-fogging agent, a drip inhibitor, and an antibacterial agent. In the additive, one component may have two or more functions.

(Antioxidant)

In one form, examples of the preferred additive include an antioxidant.

The antioxidant is not particularly limited, and a known antioxidant can be used.

Examples of the antioxidant are described in, for example, "Comprehensive Technology for Polymer Stabilization—Mechanism and Application Development—" published by CMC Publishing Co., Ltd., supervised by Yasukazu Okatsu. This description is incorporated in the present specification by reference.

Examples of the kind of the antioxidant include a phenol-based antioxidant, an amine-based antioxidant, a phosphorus-based antioxidant, and a sulfur-based antioxidant.

As the antioxidant, it is preferable to use a phenol-based antioxidant and/or an amine-based antioxidant in combination with a phosphorus-based antioxidant and/or a sulfur-based antioxidant.

Examples of the phenol-based antioxidant include ADEKA STAB AO-20, ADEKA STAB AO-30, ADEKA STAB AO-40, ADEKA STAB AO-50, ADEKA STAB AO-60, ADEKA STAB AO-80, and ADEKA STAB AO-330, manufactured by ADEKA Corporation; and IRGANOX 1010, IRGANOX 1035, IRGANOX 1076, IRGANOX 1098, IRGANOX 1135, IRGANOX 1330, IRGANOX 1726, IRGANOX 245, IRGANOX 259, IRGANOX 3114, and IRGANOX 565, manufactured by BASF Japan Ltd. The above "ADEKA STAB" and "IRGANOX" are both registered trade names.

Examples of the amine-based antioxidants include Sanol LS-770, Sanol LS-765, and Sanol LS-2626, manufactured by Mitsubishi-Chemical Foods Corporation; ADEKA STAB LA-77, ADEKA STAB LA-57, ADEKA STAB LA-52, ADEKA STAB LA-62, ADEKA STAB LA-63, ADEKA STAB LA-67, ADEKA STAB LA-68, and ADEKA STAB LA-72, manufactured by ADEKA Corporation; and TINUVIN 123, TINUVIN 144, TINUVIN 622, TINUVIN 765, and TINUVIN 944, manufactured by BASF Japan Ltd. The above "ADEKA STAB" and "TINUVIN" are both registered trade names.

Further, an amine-based compound capable of quenching radicals can also be used as the antioxidant. Examples of such an amine-based compound include polyethylene glycol bis TEMPO [Sigma-Aldrich Co., LLC] and sebacic acid bis TEMPO. Here, "TEMPO" is an abbreviation for tetramethylpiperidin-1-oxyl.

Examples of the phosphorus-based antioxidant include ADEKA STAB PEP-8, ADEKA STAB PEP-36, ADEKA STAB HP-10, and ADEKA STAB 2112, manufactured by ADEKA Corporation; and IRGAFOS 168 manufactured by BASF Japan Ltd. The above "ADEKA STAB" and "IRGAFOS" are both registered trade names.

Examples of the sulfur-based antioxidant include ADEKA STAB AO-412S and ADEKA STAB AO-5035, manufactured by ADEKA Corporation. The above "ADEKA STAB" is a registered trade name.

Among the above, the phenol-based antioxidant is preferably at least one selected from the group consisting of ADEKA STAB AO-20, ADEKA STAB AO-60, ADEKA STAB AO-80, and IRGANOX 1010, the amine-based antioxidant is preferably ADEKA STAB LA-52, the phosphorus-based antioxidant is preferably ADEKA STAB PEP-36, and the sulfur-based antioxidant is preferably ADEKA STAB AO-412S.

In a case of containing an antioxidant, the radio wave absorber and the radio wave absorbing composition may contain only one kind of antioxidant or may contain two or more kinds of antioxidants.

In a case where the above radio wave absorber and radio wave absorbing composition contain an antioxidant, the content of the antioxidant in the radio wave absorber and the radio wave absorbing composition is not particularly limited, and it is, for example, preferably 0.1 parts by mass to 10 parts by mass and more preferably 0.5 parts by mass to 5 parts by mass with respect to 100 parts by mass of the binder from the viewpoint of both suppressing the decomposition of the binder and suppressing the bleeding of the antioxidant.

(Light Stabilizer)

In one form, examples of the preferred additive include a light stabilizer.

Examples of the light stabilizer include HALS (that is, a hindered amine light stabilizer), an ultraviolet absorbing agent, and a singlet oxygen quencher.

The HALS may be a high molecular weight HALS, a low molecular weight HALS, or a combination of a high molecular weight HALS and a low molecular weight HALS.

In a case of containing a light stabilizer, the radio wave absorber and the radio wave absorbing composition may contain only one kind of light stabilizer or may contain two or more kinds thereof.

—High Molecular Weight HALS—

In the present invention and the present specification, the "high molecular weight HALS" means a hindered amine-based light stabilizer having a weight-average molecular weight of more than 1,000.

Examples of the high molecular weight HALS include, as an oligomer-type HALS, poly [6-(1,1,3,3-tetramethylbutyl)imino-1,3,5-triazine-2,4-di-yl][(2,2,6,6-tetramethyl-4-piperidyl)imino]hexamethylene [(2,2,6,6-tetramethyl-4-piperidyl)imino] and dimethyl succinate-1-(2-hydroxyethyl)-4-hydroxy-2,2,6,6-tetramethylpiperidine polycondensate.

Examples of the commercially available high molecular weight HALS product include CHIMASSORB 944LD and TINUVIN 622LD, manufactured by BASF Japan Ltd. The above "CHIMASSORB" and "TINUVIN" are both registered trade names.

The weight-average molecular weight (Mw) in the present invention and the present specification is a value measured according to gel permeation chromatography (GPC). For the measurement using the gel permeation chromatography (GPC), HLC (registered trade name)—8220GPC [manufactured by Tosoh Corporation] is used as the measuring device, TSKgel (registered trade name) Super HZM-M [4.6 mm ID×15 cm, manufactured by Tosoh Corporation], Super HZ4,000 [4.6 mm ID×15 cm, manufactured by Tosoh Corporation], Super HZ3,000 [4.6 mm ID×15 cm, manufactured by Tosoh Corporation], and Super HZ2,000 [4.6 mm ID×15 cm, manufactured by Tosoh Corporation] are connected one by one in series and used as the column, and tetrahydrofuran (THF) can be used as the eluant.

The measurement conditions can be a sample concentration of 0.2% by mass, a flow rate of 0.35 mL/min, a sample injection amount of 10 μL, and a measurement temperature of 40° C., and a differential refractive index (RI) detector can be used as the detector.

The calibration curve can be created using “Standard sample TSK standard, polystyrene”: “F-40”, “F-20”, “F-4”, “F-1”, “A-5000”, “A-2500”, and “A-1000”, manufactured by Tosoh Corporation.

In a case where the above radio wave absorber contains a high molecular weight HALS, the content of the high molecular weight HALS in the radio wave absorber is not particularly limited, and it is, for example, preferably 0.2% by mass to 10% by mass with respect to the total mass of the radio wave absorber.

The content of the high molecular weight HALS in the above radio wave absorber is preferably made be 0.2% by mass or more with respect to the total mass of the radio wave absorber from the viewpoint of improving weather fastness.

In a case where the content of the high molecular weight HALS in the radio wave absorber is 10% by mass or less with respect to the total mass of the radio wave absorber, the decrease in mechanical strength and the occurrence of blooming tend to be capable of being suppressed.

—Low Molecular Weight HALS—

In the present invention and the present specification, the “low molecular weight HALS” means a hindered amine-based light stabilizer having a molecular weight of 1,000 or less (preferably 900 or less and more preferably 600 to 900).

Examples of the low molecular weight HALS include tris(2,2,6,6-tetramethyl-4-piperidyl)benzene-1,3,5-tricarboxylate, tris(2,2,6,6-tetramethyl-4-piperidyl)-2-acetoxypropane-1,2,3-tricarboxylate, tris(2,2,6,6-tetramethyl-4-piperidyl)-2-hydroxypropane-1,2,3-tricarboxylate, tris(2,2,6,6-tetramethyl-4-piperidyl)triazine-2,4,6-tricarboxylate, tris(2,2,6,6-tetramethyl-4-piperidyl)butane-1,2,3-tricarboxylate, tetrakis(2,2,6,6-tetramethyl-4-piperidyl)propane-1,1,2,3-tetracarboxylate, tetrakis(2,2,6,6-tetramethyl-4-piperidyl) 1,2,3,4-butanetetracarboxylate, tetrakis(1,2,2,6,6-pentamethyl-4-piperidyl) 1,2,3,4-butanetetracarboxylate, and 2-(3,5-di-t-butyl-4-hydroxybenzyl)-2-n-butylmalonate bis(1,2,2,6,6-pentamethyl-4-piperidyl).

Examples of the commercially available low molecular weight HALS product include ADEKA STAB LA-57, and ADEKA STAB LA-52, manufactured by ADEKA Corporation; and TINUVIN 144 manufactured by BASF Japan Ltd. The above “ADEKA STAB” and “TINUVIN” are both registered trade names.

In a case where the above radio wave absorber contains a low molecular weight HALS, the content of the low molecular weight HALS in the radio wave absorber is not particularly limited; however, it is, for example, preferably 0.2% by mass to 10% by mass with respect to the total mass of the radio wave absorber.

The content of the low molecular weight HALS in the above radio wave absorber is preferably made be 0.2% by mass or more with respect to the total mass of the radio wave absorber from the viewpoint of improving weather fastness.

In a case where the content of the low molecular weight HALS in the radio wave absorber is 10% by mass or less with respect to the total mass of the radio wave absorber, the decrease in mechanical strength and the occurrence of blooming tend to be capable of being suppressed.

—Ultraviolet Absorbing Agent—

Examples of the ultraviolet absorbing agent include benzotriazole-based ultraviolet absorbing agents such as 2-(2'-hydroxy-3',5'-di-t-butylphenyl)benzotriazole, 2-(3,5-di-t-amyl-2-hydroxyphenyl)benzotriazole, 2-(2'-hydroxy-5'-methyl-phenyl)benzotriazole, 2-(2'-hydroxy-5'-t-octylphenyl)benzotriazole, 2-(2'-hydroxy-3',5'-di-t-amylphenyl) benzotriazole, 2-[2'-hydroxy-3'-(3",4",5",6"-tetrahydrophthalimidemethyl)-5'-methylphenyl]benzotriazole, 2,2'-methylenebis[4-(1,1,3,3-tetramethylbutyl)-6-(2H-benzotriazole-2-yl)phenol], 2-[2-hydroxy-3,5-bis(α,α-dimethylbenzyl)phenyl]-2H-benzotriazole, 2-(2-hydroxy-4-octyloxyphenyl)-2H-benzotriazole, and 2-(2H-benzotriazole-2-yl)-4-methyl-6-(3,4,5,6-tetrahydrophthalimidylmethyl)phenol; benzophenone-based ultraviolet absorbing agents such as 2-hydroxy-4-methoxybenzophenone, 2,4-dihydroxybenzophenone, 2,2'-dihydroxy-4-methoxybenzophenone, 2,2'-dihydroxy-4,4'-dimethoxybenzophenone, 2-hydroxy-4-n-octoxybenzophenone, 2,2',4,4'-tetrahydroxybenzophenone, 4-dodecyloxy-2-hydroxybenzophenone, a 3,5-di-t-butyl-4-(hydroxybenzoyl) benzoic acid n-hexadecyl ester, 1,4-bis(4-benzoyl-3-hydroxyphenoxy)butane, 1,6-bis(4-benzoyl-3-hydroxyphenoxy)hexane; and cyanoacrylate-based ultraviolet absorbing agents represented by ethyl-2-cyano-3,3-diphenylacrylate.

Examples of the commercially available ultraviolet absorbing agent include TINUVIN 320, TINUVIN 328, TINUVIN 234, TINUVIN 1577, TINUVIN 622, and IRGANOX series, manufactured by BASF Japan Ltd.; ADEKA STAB LA31 manufactured by ADEKA Corporation; and SEESORB 102, SEESORB 103, and SEESORB 501, manufactured by SHIPRO KASEI KAISHA, Ltd. The above-described “TINUVIN”, “IRGANOX”, “ADEKA STAB”, and “SEESORB” are all registered trade names.

In a case where the above radio wave absorber contains an ultraviolet absorbing agent, the content of the ultraviolet absorbing agent in the radio wave absorber is not particularly limited, and it is, for example, preferably 0.2% by mass to 10% by mass with respect to the total mass of the radio wave absorber.

The content of the ultraviolet absorbing agent in the above radio wave absorber is preferably set to 0.2% by mass or more with respect to the total mass of the radio wave absorber from the viewpoint of improving weather fastness.

In a case where the content of the ultraviolet absorbing agent in the radio wave absorber is 10% by mass or less with respect to the total mass of the radio wave absorber, the decrease in mechanical strength and the occurrence of blooming tend to be capable of being suppressed.

—Singlet Oxygen Quencher—

In a case where the above radio wave absorber contains a singlet oxygen quencher, the content of the singlet oxygen quencher in the radio wave absorber is not particularly limited, and it is, for example, preferably 0.2% by mass to 10% by mass with respect to the total mass of the radio wave absorber.

The content of the singlet oxygen quencher in the above radio wave absorber is preferably made be 0.2% by mass or more with respect to the total mass of the radio wave absorber from the viewpoint of improving weather fastness.

In a case where the content of the singlet oxygen quencher in the radio wave absorber is 10% by mass or less with respect to the total mass of the radio wave absorber, the decrease in mechanical strength and the occurrence of blooming tend to be capable of being suppressed.

In a case of containing a light stabilizer, the above radio wave absorber may contain only one kind of light stabilizer or may contain two or more kinds of light stabilizers.

<Methods of Manufacturing Radio Wave Absorbing Composition and Radio Wave Absorber>

The methods of manufacturing the radio wave absorbing composition and the radio wave absorber are not particularly limited. The radio wave absorbing composition of the present disclosure can be manufactured according to a known method using, for example, the magnetic powder, a binder, and, as necessary, a solvent, an additive. For example, the radio wave absorber can be a molded product formed by molding the radio wave absorbing composition. The radio wave absorbing composition can be prepared as a kneaded material by kneading, while heating, a mixture obtained by mixing the magnetic powder, the binder, and, as necessary, a solvent, an additive, and the like. The kneaded material can be obtained in any shape, for example, an aggregated shape, a pellet, or a filament that can be used for a three-dimensional (3D) printer. The kneaded material is molded into a desired shape by a known molding method such as extrusion molding, press molding, injection molding, in-mold forming, or 3D print shaping, whereby a radio wave absorber (a molded product) can be obtained. The shape of the radio wave absorber is not particularly limited and may be any shape such as a plate shape or a linear shape. The "plate shape" includes a sheet shape and a film shape. The plate-shaped radio wave absorber can also be called a radio wave absorbing plate, a radio wave absorbing sheet, a radio wave absorbing film, or the like. The radio wave absorber may be a radio wave absorber having a single composition (for example, a single-layer radio wave absorbing plate) or a combination of two or more parts having different compositions (for example, a laminate). Further, the radio wave absorber may have a planar shape, may have a three-dimensional shape, or may be a combination of a portion having a planar shape and a portion having a three-dimensional shape. Examples of the planar shape include a sheet shape and a film shape. Examples of the three-dimensional shape include a tubular shape (a cylindrical shape, rectangular tubular shape, or the like), a horn shape, and a box shape (for example, at least one of the surfaces thereof is open).

For example, the thickness of the radio wave absorber is preferably 20 mm or less, more preferably 10 mm or less, and still more preferably 5 mm or less, from the viewpoint of easiness of handling. From the viewpoint of mechanical properties, the thickness is preferably 1 mm or more and more preferably 2 mm or more. In a case where the thickness of the radio wave absorber is adjusted, for example, the transmission attenuation amount described later can be adjusted. In a case where the radio wave absorber is a laminate, the thickness means the total thickness of the radio wave absorber constituting the laminate. The thickness of the radio wave absorber is a value measured using a digital length measuring machine and, specifically, is an arithmetic mean of the measured values measured at nine points which are randomly selected.

The radio wave absorbing composition may contain or may not contain a solvent. In a case where the radio wave absorbing composition contains a solvent, the solvent is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, and cyclohexanone, tetrahydrofuran, acetonitrile, ethyl acetate, and toluene. Among these, the solvent is preferably ketones and more preferably cyclohexanone from the viewpoint of drying rate. In a case where the radio wave absorbing composition contains a solvent, the content of the solvent in the composition is not particularly limited and may be determined depending on the manufacturing method for a radio wave absorber.

The radio wave absorbing composition can be prepared by mixing the above components. The mixing method is not particularly limited, and examples thereof include a method of mixing by stirring. As the stirring unit, a known stirring device can be used. Examples of the stirring device include mixers such as a paddle mixer and an impeller mixer. The stirring time may be set depending on the kind of the stirring device, the composition of the radio wave absorbing composition.

Examples of one form of the manufacturing method for a radio wave absorber include a method of molding the radio wave absorbing composition into a desired shape by a known molding method as exemplified above.

In addition, examples of another form of the manufacturing method for a radio wave absorber include a method of applying the radio wave absorbing composition onto a support and manufacturing a radio wave absorber as a radio wave absorbing layer. The support that is used here may be removed before the radio wave absorber is incorporated into an article to which the radio wave absorbability should be imparted or may be incorporated into the article together with the radio wave absorber without being removed.

The support is not particularly limited, and a well known support can be used. Examples of the support include a metal plate (a plate of metal such as aluminum, zinc, or copper), a glass plate, a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which the metal exemplified in the metal plate described above is laminated or vapor-deposited. The plastic sheet is preferably biaxially stretched. The shape, structure, size, and the like of the support can be appropriately selected.

Examples of the shape of the support include a plate shape. The structure of the support may be a monolayer structure or a laminated structure of two or more layers. The size of the support can be appropriately selected depending on the size of the radio wave absorber. The thickness of the support is generally approximately 0.01 mm to 10 mm, for example, preferably 0.02 mm to 3 mm and more preferably 0.05 mm to 1 mm, from the viewpoint of handleability.

The method of applying the radio wave absorbing composition on a support is not particularly limited, and examples thereof include methods using a die coater, a knife coater, and an applicator. The method of drying the coating film formed by applying the radio wave absorbing composition is not particularly limited, and examples thereof include a method using a known heating device such as an oven. The drying temperature and the drying time are not particularly limited. For example, the drying temperature can be in a range of 70° C. to 90° C., and the drying time can be in a range of 1 hour to 3 hours.

The radio wave absorber can be incorporated into various articles to which radio wave absorbability is desired to be imparted. For example, the plate-shaped radio wave absorber can be incorporated into an article in any form as it is or by being bent at any portion. In addition, it can be adjusted to a desired shape by injection molding or the like to be incorporated into an article.

A radio wave absorber that exhibits excellent transmission attenuation characteristics is useful for improving the recognition accuracy of a radar. Examples of the indicator of the transmission attenuation characteristics include a transmission attenuation amount. In order to improve the recognition accuracy of the radar, it is desirable to increase the directivity of the radar. A high transmission attenuation amount can contribute to the improvement of the directivity of the radar. From the viewpoint of improving the directivity of the radar, the transmission attenuation amount of the radio wave absorber is preferably 5.0 dB or more, more preferably 8.0 dB or more, and still more preferably 10.0 dB or more. The transmission attenuation amount of the radio wave absorber can be, for example, 15.0 dB or less, 14.5 dB or less, 14.0 dB or less, 13.5 dB or less, 13.0 dB or less, or 12.5 dB or less. However, from the viewpoint of improving the directivity of the radar, it is preferable that the transmission attenuation amount of the radio wave absorber is high. Accordingly, the transmission attenuation amount of the radio wave absorber may exceed the values exemplified above. The transmission attenuation amount can be, for example, a value that is measured regarding a radio wave absorber having a thickness of 2 mm. In one form, the radio wave absorber can exhibit the transmission attenuation amount in the above range at the peak top of the frequency determined by the method described in Examples described later.

By the way, the on-vehicle radar, which has been attracting attention in recent years, is a radar that uses radio waves in the millimeter wave frequency band. The millimeter wave is an electromagnetic wave having a frequency of 30.0 GHz to 300.0 GHz. The radio wave absorber preferably exhibits a transmission attenuation amount in the above respective ranges with respect to a frequency of the radio wave, that is, one or more frequencies in the frequency band of 3 terahertz (THz) or less. From the viewpoint of usefulness for improving the recognition accuracy of the on-vehicle radar, the frequency at which the radio wave absorber exhibits a transmission attenuation amount in the above range is preferably a millimeter wave frequency band, that is, one or more frequencies in the frequency band of 30.0 GHz to 300.0 GHz, more preferably one or more frequencies in the frequency band of 60.0 GHz to 90.0 GHz, and still more preferably one or more frequencies in the frequency band of 75.0 GHz to 85.0 GHz. Such a radio wave absorber is suitable as a radio wave absorber that is incorporated on a front side (an incident side of the radio wave incident from the outside) of the radio wave transmitting and receiving unit in the on-vehicle radar in order to reduce the side lobe of the on-vehicle millimeter-wave radar.

In addition, from the viewpoint of usefulness for improving the recognition accuracy of the radio wave absorbing article that is used in the wireless technical field, such as a motion sensor, the frequency at which the radio wave absorber exhibits a transmission attenuation amount in the above range is preferably a millimeter wave frequency band, that is, one or more frequencies in the frequency band of 30.0 GHz to 300.0 GHz, more preferably one or more frequencies in the frequency band of 50.0 GHz to 90.0 GHz, and still more preferably one or more frequencies in the frequency band of 55.0 GHz to 66.0 GHz. Such a radio wave absorber is suitable as a radio wave absorber for improving recognition accuracy by removing unnecessary radio waves in wireless equipment such as an internal sensor of a cellular phone and a biological information sensor. Such a radio wave absorber can be suitably used, for example, in a radio wave absorbing article for a band of 55.0 to 66.0 GHz. The radio wave absorbing article is an article having radio wave absorbability to radio waves of one or more frequencies, and in a case where a radio wave absorber is incorporated into the article as at least a part thereof, the above radio wave absorbability can be obtained. The radio wave absorbing article for a band of 55.0 to 66.0 GHz is an article having radio wave absorbability to radio waves of one or more frequencies in a frequency band of 55.0 to 66.0 GHz. Examples of such an article include the above-described various wireless equipment. In a case where the radio wave absorber is incorporated into such a radio wave absorbing article, unnecessary radio waves can be removed, and thus the recognition accuracy can be improved.

The "transmission attenuation amount" in the present invention and the present specification is a value obtained by measuring an S parameter in a measurement environment at an ambient temperature of 15° C. to 35° C. with a free space method by setting an incidence angle of 0° and being determined as S21 of the S parameter. The measurement can be carried out using a known vector network analyzer and horn antenna. Examples of the specific example of the measurement method include the methods described in Examples described later.

In addition, the bandwidth may be wide-banded depending on the kind of radar in which the radio wave absorber is used. For example, a radar for a 60 GHz band may be used in a 7.0 GHz bandwidth in a range of 57.0 to 64.0 GHz. For a use application to a radar having such a wideband bandwidth, a plurality of kinds of magnetic powders can be mixed to prepare a radio wave absorber that can be compatible with bandwidth widening, and/or a plurality of kinds of radio wave absorbers can be also mixed to prepare a radio wave absorber that can be compatible with bandwidth widening.

[Radio Wave Absorbing Article]

One aspect of the present invention relates to a radio wave absorbing article including the radio wave absorber. Specific examples of the radio wave absorbing article include an on-vehicle radar. Specific examples thereof include wireless equipment such as an internal sensor of a cellular phone and a biological information sensor. In addition, in one form, the radio wave absorbing article can be a radio wave absorbing article in a band of 55.0 GHz to 66.0 GHz. It suffices that the radio wave absorbing article includes the radio wave absorber according to one aspect of the present invention. Other configurations of the radio wave absorbing article are not particularly limited, and a known technique related to the radio wave absorbing article can be applied.

EXAMPLES

Hereinafter, the present invention will be described based on Examples. However, the present invention is not limited to the embodiments shown in Examples. Unless otherwise specified, steps and evaluations described below were carried out in an environment of an ambient air atmosphere of an ambient temperature of 23° C.±1° C.

Example 1

<Preparation of Magnetic Powder>

Using Wonder Crush/Mill (model WDL-1: manufactured by Osaka Chemical Co., Ltd.), 46.3 g of strontium carbonate [$SrCO_3$; manufactured by Fujifilm Wako Pure Chemical Corporation], 255.1 g of α-iron (III) oxide [α-$Fe_2O_3$; manufactured by Fujifilm Wako Pure Chemical Corporation], and 14.8 g of aluminum oxide [$Al_2O_3$; manufactured by Fujifilm Wako Pure Chemical Corporation, average particle size: 40 nm] were stirred for 2 minutes. 300 g of water and a flux (strontium chloride hexahydrate [$SrCl_2 \cdot 6H_2O$; manufactured by FUJIFILM Wako Pure Chemical Corporation]) were added to the obtained mixture, stirring was carried out for 30 minutes with a WARING blender (model: 7011HSJ, manufactured by WARING Commercial), and then drying was carried out in a drying device having an internal ambient temperature of 95° C. The adding amount of the flux was set to the adding amount shown in the column of the flux amount in Table 1, assuming that the total of the raw materials (strontium carbonate, α-iron (III) oxide, and aluminum oxide) was 100% by mass.

Next, using the Wonder Crush/Mill, the dried mixture was stirred and pulverized for 2 minutes to obtain a precursor of a magnetic powder.

The obtained precursor was put in a muffle furnace, and the temperature in the furnace was set to a temperature condition of 1,200° C. in an ambient air atmosphere, followed by sintering for 4 hours to obtain a sintered product.

Using the Wonder Crush/Mill, the obtained sintered product was stirred and pulverized for 2 minutes, repeatedly washed with water, and then drying was carried out in a drying device having an internal ambient temperature of 95° C. Then, using the Wonder Crush/Mill, stirring and pulverization were carried out for 2 minutes to obtain a magnetic powder.

<Preparation of Radio Wave Absorber>

The magnetic powder was introduced into a kneader (Labo Plastomill manufactured by Toyo Seiki Seisaku-sho, Ltd.) together with a binder (an olefin-based thermoplastic elastomer (TPO) [MILASTOMER (registered trade name) 7030NS manufactured by Mitsui Chemicals, Inc.]) and kneaded for 20 minutes at a set temperature of the kneader of 200° C. to obtain a composition for forming a radio wave absorber (an aggregated kneaded material), where the magnetic powder has such an amount that the volume filling rate of the magnetic powder in the radio wave absorbing composition was 30% by volume.

The obtained composition for forming a radio wave absorber was press-molded using a heating press machine to obtain a radio wave absorber (a radio wave absorbing sheet) as a plate-shaped molded product having a square plane, one side of which had a length of 100 mm.

For each of the radio wave absorbers in Example 1 and Examples 2 to 14 described later and Comparative Examples 1 to 5, the thickness was determined as the arithmetic mean of the measured values measured at nine points which were randomly selected, using a digital length measuring machine [Litematic (registered trade name) VL-50 Å manufactured by Mitutoyo Corporation]. All the thicknesses of the above radio wave absorbers were 2 mm.

Examples 2 to 14 and Comparative Examples 1 to 5

A magnetic powder and a radio wave absorber were prepared in the same manner as in Example 1, except that various items shown in Table 1 were changed as shown in Table 1.

In Examples and Comparative Examples in which x in Formula 1 was different from that of Example 1, various raw materials were mixed at a proportion, at which a hexagonal ferrite having the composition in which the value of x was the value shown in Table 1, was obtained.

In Examples and Comparative Examples in which "Sr" was described in the column of the A atom of Formula 1 in Table 1, strontium carbonate [$SrCO_3$; manufactured by Fujifilm Wako Pure Chemical Corporation] was used as the compound of the A atom to prepare a magnetic powder.

In Examples in which "Ba" was described in the column of the A atom of Formula 1 in Table 1, strontium carbonate [$SrCO_3$; manufactured by Fujifilm Wako Pure Chemical Corporation] was changed to barium carbonate [$BaCO_3$; manufactured by Fujifilm Wako Pure Chemical Corporation], whereby a magnetic powder was prepared.

In Examples and Comparative Examples in which "Sr/Ba" was described in the column of the A atom of Formula 1 in Table 1, strontium carbonate [$SrCO_3$; manufactured by Fujifilm Wako Pure Chemical Corporation] and barium carbonate [$BaCO_3$; manufactured by Fujifilm Wako Pure Chemical Corporation] were used to prepare a magnetic powder.

In Examples and Comparative Examples in which "$BaCl_2 \cdot 2H_2O$" was described in the column of the flux in Table 1, barium chloride dihydrate [$BaCl_2 \cdot 2H_2O$; manufactured by FUJIFILM Wako Pure Chemical Corporation] was used to prepare a magnetic powder.

In Table 1, regarding Examples in which "40 nm" was described in the column of the raw material Al size, aluminum oxide manufactured by FUJIFILM Wako Pure Chemical Corporation [model number: aluminum oxide, 40 to 50 nm] was used as the aluminum oxide.

In Table 1, in Examples in which "2 μm" was described in the column of the raw material Al size, aluminum oxide manufactured by FUJIFILM Wako Pure Chemical Corporation [model number: α-alumina, 1 to 2 μm] was used.

In Table 1, in Examples and Comparative Examples in which "75 μm" was described in the column of the raw material Al size, aluminum oxide manufactured by FUJIFILM Wako Pure Chemical Corporation [model number: Particle Size (Pass 75 μm)] was used as the aluminum oxide.

In Table 1, in Examples and Comparative Examples in which "150 μm" was described in the column of the raw material Al size, aluminum oxide manufactured by NIPPON STEEL Chemical & Material Co., Ltd. [model number: AZ75-150] was used as the aluminum oxide.

The average particle size of the aluminum oxide, described in the column of the raw material Al size in Table 1 is D50 which is determined from a measured particle size distribution which is obtained by measuring a volume-based particle size distribution of the aluminum oxide powder collected, as a sample powder for measurement, from the above-described commercially available product, according to a laser diffraction and scattering method by the method described above.

[Evaluation of Magnetic Powder]

<Checking of Presence of Region B, Measurement Relating to Expression 2 and Expression 3>

For each of the magnetic powders prepared as described above according to the method described above, the presence or absence of the region B was checked, and the evaluation relating to Expression 2 and Expression 3 was carried out. An ion coater EIKO 1B-5 manufactured by EIKO Corporation was used as an ion coater for Pt vapor deposition, FE-SEM SU8220 manufactured by Hitachi High-Tech Corporation was used as an SEM, and ImageJ, which is free software, was used as image processing software. The binarization processing was carried out by setting the binarization processing condition of ImageJ to 8-bit and setting the default condition of the threshold value to AUTO.

The value of "content of A atom in region B/content of Al atom in region B" calculated from the measurement results is shown in the column of "Expression 2" in Table 1. The value of "total of content of A atom and content of Al atom in region B/total of content of A atom and content of Al atom in entire powder" calculated from the measurement results is shown in the column of "Expression 3" in Table 1. The long side diameter of the region B shown in Table 1 is the arithmetic mean of the long side diameters of a plurality of bright regions as described above.

<Peak Particle Diameter>

The volume-based particle size distribution of each of the magnetic powders prepared as described above was measured according to a laser diffraction and scattering method by the method described above, and the most frequent value (the mode diameter) was determined from the measured particle size distribution. The mode diameter determined in this way is shown in Table 1 as "Peak particle diameter".

<Checking of Crystal Structure>

The crystal structure of the magnetic material prepared as described above, which constitutes each of the magnetic powders prepared as described above, was checked by X-ray diffraction analysis. As the measuring device, X'Pert Pro manufactured by PANalytical Co., Ltd., which is a powder X-ray diffractometer, was used. The measurement conditions are shown below.

—Measurement Conditions—

X-ray source: CuKα ray

[Wavelength: 1.54 Å (0.154 nm), output: 40 mA, 45 kV]

Scan range: 20 degrees<2θ<70 degrees

Scan interval: 0.05 degrees

Scan speed: 0.75 degrees/min

As a result of the X-ray diffraction analysis, it has been confirmed that all the magnetic powders have a magnetoplumbite-type crystal structure and are a single-phase powder of a magnetoplumbite-type hexagonal ferrite that does not include a crystal structure other than the magnetoplumbite-type crystal structure.

<Checking of Composition>

The composition of the magnetic material prepared as described above, which constitutes each of the magnetic powders prepared as described above was checked by a high frequency inductively coupled plasma emission spectroscopic analysis. Specifically, the checking was carried out according to the following method.

A container (a beaker) containing 12 mg of the magnetic powder and 10 mL of an aqueous solution of hydrochloric acid of a concentration of 4 mol/L was held on a hot plate at a set temperature of 120° C. for 3 hours to obtain a dissolution solution. 30 mL of pure water was added to the obtained dissolution solution, which is then filtered using a membrane filter having a filter pore diameter of 0.1 μm. Elemental analysis of the filtrate obtained as described above was carried out using a high frequency inductively coupled plasma emission spectrometer [ICPS-8100, manufactured by Shimadzu Corporation]. Based on the obtained elemental analysis results, a content of each atom with respect to 100% by atom of the iron atom was obtained. Then, based on the obtained content, the composition of the magnetic material was checked. As a result, it has been confirmed that in the composition of each of the magnetic powders, A in Formula 1 is an atom shown in the column of "A atom" in Table 1, and x has a composition of the value shown in Table 1.

In Table 1, regarding Example 3, Comparative Example 3, and Comparative Example 4, in which "Sr/Ba" was described in the column of the A atom of Formula 1, Sr and Ba are detected as the A atom in the above-described element analysis. Assuming that the total of the detected A atoms was 100% by atom, the content of Sr was 75% by atom in Example 2 and 89% by atom in Comparative Example 3 and Comparative Example 4.

On the other hand, as a result of the above-described element analysis, it was confirmed that in Table 1, in Examples and Comparative Examples in which "Sr" is described in the column of the A atom of Formula 1, A in Formula 1 is only Sr, and that in Examples in which "Ba" is described in the column of the A atom of Formula 1, A in Formula 1 is only Ba. As described above, the fact that A in Formula 1 is only Sr means that in a case where the total of the A atom (that is, the total of Sr, Ba, Ca, and Pb) is set to 100% by atom, the content of Sr is 95% by atom or more. The fact that A in Formula 1 is only Ba means that in a case where the total of the A atom (that is, the total of Sr, Ba, Ca, and Pb) is set to 100% by atom, the content of Ba is 95% by atom or more.

<Ratio (σs/β)>

As a result of calculating the ratios (σs/β) of the magnetic powder prepared in Example 1 and the magnetic powder prepared in Example 4 from σs and β, which had been measured according to the following method, all the ratios were 240 emu·$g^{-1}$·$degree^{-1}$ or more.

The saturation magnetization σs was measured according to the following method.

As the measuring device, an oscillating sample magnetometer (model number: TM-TRVSM5050-SMSL) manufactured by TAMAKAWA Co., Ltd. was used in an environment of an ambient air atmosphere of an ambient temperature of 23° C. and under the conditions of a maximum applied magnetic field of 50 kOe, and a magnetic field sweep rate of 25 Oe/s, and each of the above-described magnetic powders was subjected to the measurement of the intensity of magnetization of the magnetic powder with respect to the applied magnetic field. From the measurement results, a magnetic field (H)-magnetization (M) curve of the magnetic powder was obtained. Based on the obtained magnetic field (H)-magnetization (M) curve, the saturation magnetization σs (unit: emu/g) was determined.

β Was Measured According to the Following Method.

As the measuring device, X'Pert Pro manufactured by PANalytical Co., Ltd., which is a powder X-ray diffractometer, was used, and an X-ray diffraction spectrum was obtained for each of the above-described magnetic powders under the following measurement conditions. In the X-ray diffraction spectrum obtained for each of the magnetic powders, a diffraction peak on the (107) plane was confirmed as a peak having an apex at a position of about 32.5 degrees. For each of the magnetic powders, the half-width β of the diffraction peak on the (107) plane was determined by an analysis software (HighScore Plus, manufactured by PANalytical, Inc.) installed in the above-described powder X-ray diffractometer.

—Measurement Conditions—

X-ray source: CuKα ray

[Wavelength: 1.54 Å (0.154 nm), output: 40 mA, 45 kV]

Scan range: 25 degrees<2θ<35 degrees

Scan interval: 0.05 degrees

Scan speed: 0.33 degrees/min

[Evaluation of Radio Wave Absorber]

<Transmission Attenuation Amount>

The frequency ("Peak top" in Table 1) at which the absorption peak of transmission attenuation of each of the above-described radio wave absorbers is present was measured according to the following method. Here, the frequency at which the absorption peak of the transmission attenuation is present shall refer to a frequency at which the transmission attenuation amount is the maximum value in the sweep frequency band.

As measuring devices, a vector network analyzer (product name: N5225B) manufactured by Keysight Technologies and a horn antenna (product name: RH12S23, RH06S10)

manufactured by KEYCOM Corp. were used to measure an S parameter every 0.1 GHz according to a free space method by setting an incidence angle to 0° and a sweep frequency band to 55.0 GHz to 95.0 GHz and 110.0 GHz to 170.0 GHz, with one plane of each of the above radio wave absorbers being directed toward the incident side. Then, S21 of the S parameter was taken as the transmission attenuation amount, and the frequency at which the transmission attenuation amount is the maximum value in the sweep frequency band was taken as the peak top, which is shown in Table 1, and the maximum value of the transmission attenuation amount in the sweep frequency band is shown in Table 1 as the transmission attenuation amount. Based on the transmission attenuation amount shown in Table 1, the transmission attenuation characteristics were evaluated according to the following evaluation standards.

A: Transmission attenuation amount is 10.0 dB or more.

B: Transmission attenuation amount is 8.0 dB or more and less than 10.0 dB.

C: Transmission attenuation amount is 5.0 dB or more and less than 8.0 dB.

D: Transmission attenuation amount is less than 5.0 dB.

The above results are shown in Table 1. From the results shown in Table 1, it can be confirmed that the radio wave absorbers of Examples have excellent transmission attenuation characteristics as compared with the radio wave absorbers of Comparative Examples.

TABLE 1

| | Formula 1 | | | | | SEM/EDS measurement results Region B | | | |
|---|---|---|---|---|---|---|---|---|---|
| | A atom | x | Flux | Flux amount (% by mass) | Raw material Al size | Long side diameter (μm) | A atom (% by atom) | Al (% by atom) | Expression 2 |
| Example 1 | Sr | 1.00 | $SrCl_2 \bullet 6H_2O$ | 10.0 | 40 nm | 0.3 | 37.7 | 9.1 | 4.1 |
| Example 2 | Sr | 1.00 | $SrCl_2 \bullet 6H_2O$ | 10.0 | 75 μm | 0.5 | 11.3 | 33.8 | 0.3 |
| Example 3 | Sr/Ba | 1.00 | $BaCl_2 \bullet 2H_2O$ | 10.0 | 40 nm | 0.3 | 31.0 | 9.3 | 3.3 |
| Example 4 | Sr | 1.70 | $SrCl_2 \bullet 6H_2O$ | 10.0 | 40 nm | 0.4 | 36.5 | 14.5 | 2.5 |
| Example 5 | Sr | 2.50 | $SrCl_2 \bullet 6H_2O$ | 15.0 | 40 nm | 0.5 | 35.6 | 20.3 | 1.8 |
| Example 6 | Sr | 4.80 | $SrCl_2 \bullet 6H_2O$ | 20.0 | 40 nm | 0.3 | 34.1 | 21.2 | 1.6 |
| Example 7 | Sr | 1.00 | $SrCl_2 \bullet 6H_2O$ | 30.0 | 40 nm | 0.5 | 35.4 | 8.4 | 4.2 |
| Example 8 | Sr | 0.40 | $SrCl_2 \bullet 6H_2O$ | 10.0 | 40 nm | 0.4 | 39.9 | 4.1 | 9.7 |
| Example 9 | Sr | 0.10 | $SrCl_2 \bullet 6H_2O$ | 10.0 | 40 nm | 0.3 | 45.1 | 2.0 | 22.6 |
| Example 10 | Sr | 1.00 | $SrCl_2 \bullet 6H_2O$ | 5.0 | 40 nm | 0.3 | 35.5 | 10.1 | 3.5 |
| Example 11 | Sr | 1.00 | $SrCl_2 \bullet 6H_2O$ | 3.0 | 40 nm | 0.2 | 35.1 | 8.2 | 4.3 |
| Example 12 | Ba | 1.50 | $BaCl_2 \bullet 2H_2O$ | 10.0 | 40 nm | 0.3 | 35.3 | 13.2 | 2.7 |
| Example 13 | Ba | 2.00 | $BaCl_2 \bullet 2H_2O$ | 10.0 | 40 nm | 0.3 | 31.0 | 13.5 | 2.3 |
| Example 14 | Sr | 1.00 | $SrCl_2 \bullet 6H_2O$ | 10.0 | 2 μm | 0.4 | 26.0 | 18.0 | 1.4 |
| Comparative Example 1 | Sr | 1.00 | Absent | — | 75 μm | Presence of region B: Absent | | | |
| Comparative Example 2 | Sr | 1.00 | $SrCl_2 \bullet 6H_2O$ | 0.2 | 75 μm | 0.2 | 12.9 | 8.2 | 1.6 |
| Comparative Example 3 | Sr/Ba | 1.40 | $BaCl_2 \bullet 2H_2O$ | 2.7 | 150 μm | 0.5 | 7.0 | 45.0 | 0.2 |
| Comparative Example 4 | Sr/Ba | 1.70 | $BaCl_2 \bullet 2H_2O$ | 2.7 | 150 μm | 0.3 | 6.3 | 42.3 | 0.1 |
| Comparative Example 5 | Sr | 0.05 | $SrCl_2 \bullet 6H_2O$ | 10.0 | 75 μm | 0.3 | 49.0 | 2.0 | 24.5 |

| | SEM/EDS measurement results | Entire powder | | Peak | Transmission attenuation characteristics | | |
|---|---|---|---|---|---|---|---|
| | Expression 3 | A atom (% by atom) | Al (% by atom) | particle diameter (μm) | Peak top (GHz) | Transmission attenuation amount (dB) | Evaluation |
| Example 1 | 1.8 | 14.5 | 11.1 | 5.5 | 63.9 | 11.4 | A |
| Example 2 | 1.5 | 16.3 | 13.8 | 6.4 | 63.4 | 7.2 | C |
| Example 3 | 1.7 | 12.7 | 10.9 | 5.3 | 61.3 | 9.3 | B |
| Example 4 | 1.5 | 14.4 | 18.9 | 5.9 | 76.5 | 11.5 | A |
| Example 5 | 1.5 | 13.6 | 23.9 | 5.9 | 90.1 | 11.0 | A |
| Example 6 | 1.4 | 13.1 | 27.2 | 6.5 | 139.0 | 8.4 | B |
| Example 7 | 1.8 | 14.2 | 10.7 | 11.1 | 63.5 | 9.1 | B |
| Example 8 | 2.2 | 15.5 | 4.5 | 6.1 | 57.1 | 10.2 | A |
| Example 9 | 2.5 | 16.2 | 2.6 | 5.9 | 55.2 | 7.9 | C |
| Example 10 | 1.9 | 13.9 | 10.5 | 4.5 | 63.2 | 10.1 | A |
| Example 11 | 1.7 | 14.9 | 11.2 | 3.5 | 61.2 | 9.7 | B |
| Example 12 | 1.5 | 14.2 | 19.0 | 5.4 | 63.4 | 10.9 | A |
| Example 13 | 1.3 | 13.5 | 22.0 | 5.7 | 76.1 | 12.2 | A |
| Example 14 | 1.6 | 15.3 | 12.3 | 6.1 | 63.7 | 9.9 | B |
| Comparative Example 1 | Presence of region B: Absent | | | 8.2 | 56.8 | 2.9 | D |
| Comparative Example 2 | 1.1 | 12.5 | 7.5 | 7.5 | 57.8 | 4.4 | D |
| Comparative Example 3 | 2.1 | 13.3 | 11.2 | 12.8 | 67.1 | 3.8 | D |

TABLE 1-continued

| | | | | | | | |
|---|---|---|---|---|---|---|---|
| Comparative Example 4 | 1.5 | 14.2 | 18.5 | 4.4 | 72.1 | 3.5 | D |
| Comparative Example 5 | 2.7 | 18.4 | 0.5 | 8.5 | 55.1 | 2.9 | D |

Example 15

As a specific example of a radio wave absorber that can be compatible with bandwidth widening, a radio wave absorber of Example 15 was prepared according to the method described for Example 1, except that half the amount (based on mass) of the magnetic powder was replaced with the magnetic powder prepared by the method described in Example 8.

The transmission attenuation amount of the prepared radio wave absorber was evaluated according to the method described above. As a result, it has been confirmed that the radio wave absorber of Example 15 exhibits a transmission attenuation amount of 5.0 dB or more in the entire range of 57.0 to 64.0 GHz, and thus it is a radio wave absorber suitable for a use application to a radar having a wide bandwidth.

Example 16

<Preparation of radio wave absorbing composition (filament for 3D printer)>

A mixture having the following composition was prepared, and a filament for a 3D printer having a diameter of 1.75 mm was prepared using a compounding tester manufactured by TECHNOVEL CORPORATION.

Magnetic powder: A magnetic powder mixture (723 g) obtained by mixing the magnetic powder prepared by the method described in Example 1 with the magnetic powder prepared by the method described in Example 8 at a mixing ratio of 1:1 (based on mass)

Resin: PETG (Glycol-modified polyethylene terephthalate; filament for 3D Printer, manufactured by RS Components, RS PRO Clear 1.75 mm) (278 g)

Antioxidant: AO-60 (2.8 g) manufactured by ADEKA Corporation

<Preparation of Radio Wave Absorber (3D Printed Object)>

The filament for a 3D printer obtained as above was attached to a 3D printer (Value 3D Magix MF-2500EP2 manufactured by MUTOH INDUSTRIES LTD.), 3D printing was carried out under the conditions of a nozzle temperature of 243° C. and a stage temperature of 70° C., thereby obtaining a radio wave absorber (a 3D printed object) as a flat plate having a size of 110 mm×110 mm with a thickness of 1.9 mm.

The transmission attenuation amount of the obtained flat plate was evaluated according to the method described above. As a result, it has been confirmed that the radio wave absorber of Example 16 exhibits a transmission attenuation amount of 5.0 dB or more in the entire range of 57.0 to 64.0 GHz.

From the above results, it has been confirmed that a radio wave absorber suitable for a use application to a radar having a wide bandwidth can be molded even by 3D print shaping.

One aspect of the present invention is useful in the technical field of carrying out various automatic driving controls such as automatic driving control of an automobile, and the wireless technical field such as a motion sensor field.

What is claimed is:

1. A magnetic powder for a radio wave absorber, wherein the magnetic powder is a powder of a hexagonal ferrite, having a composition represented by Formula 1:

$$AFe_{(12-x)}Al_xO_{19} \quad \text{(Formula 1)}$$

in Formula 1, A represents one or more kinds of atoms selected from the group consisting of Sr, Ba, Ca, and Pb, and x satisfies $0.10 \le x \le 5.00$, and a region B is present on a particle surface of the powder, and the magnetic powder satisfies a relational expression of Expression 2 and Expression 3:

$$0.3 \le \text{content of } A \text{ atom in region } B/\text{content of Al atom in region } B \le 23.0, \quad \text{(Expression 2)}$$

$$1.2 \le \text{total of content of } A \text{ atom and content of Al atom in region } B/\text{total of content of } A \text{ atom and content of Al atom in entire powder} \le 2.5, \quad \text{(Expression 3)}$$

the content is a content in which a total of an A atom, an Fe atom, and an Al atom is set to 100% by atom, and a unit of the content is % by atom, the region B is a region that is observed as a bright region having a long side diameter of 0.1 μm or more and 0.6 μm or less in an image subjected to binarization processing, which is obtained by subjecting an image obtained by imaging the particle surface with a scanning electron microscope, to the binarization processing, and a peak particle diameter of the magnetic powder is 4.5 μm or more and 9.0 μm or less.

2. The magnetic powder for a radio wave absorber according to claim 1, wherein in Formula 1, the A atom is one or two kinds of atoms selected from the group consisting of Sr and Ba.

3. The magnetic powder for a radio wave absorber according to claim 1, wherein the magnetic powder further satisfies a relational expression of Expression 4:

$$1.5 \le \text{content of } A \text{ atom in region } B/\text{content of Al atom in region } B \le 10.0, \text{ and} \quad \text{(Expression 4)}$$

the content is a content in which a total of an A atom, an Fe atom, and an Al atom is set to 100% by atom, and a unit of the content is % by atom.

4. The magnetic powder for a radio wave absorber according to claim 2, wherein the magnetic powder further satisfies a relational expression of Expression 4:

$$1.5 \le \text{content of } A \text{ atom in region } B/\text{content of Al atom in region } B \le 10.0, \text{ and} \quad \text{(Expression 4)}$$

the content is a content in which a total of an A atom, an Fe atom, and an Al atom is set to 100% by atom, and a unit of the content is % by atom.

5. The magnetic powder for a radio wave absorber according to claim 1, wherein the magnetic powder is a powder of a hexagonal ferrite in which a ratio of a saturation magnetization σs to a half-width β of a diffraction peak on a (107) plane, $\sigma s/\beta$, is 240 emu·$g^{-1}$·$degree^{-1}$ or more, where the half-width $\beta$ is determined by X-ray diffraction analysis.

6. The magnetic powder for a radio wave absorber according to claim 3, wherein the magnetic powder is a powder of a hexagonal ferrite in which a ratio of a saturation magnetization $\sigma s$ to a half-width $\beta$ of a diffraction peak on a (107) plane, $\sigma s/\beta$, is 240 emu $g^{-1}$·$degree^{-1}$ or more, where the half-width $\beta$ is determined by X-ray diffraction analysis.

7. The magnetic powder for a radio wave absorber according to claim 4, wherein the magnetic powder is a powder of a hexagonal ferrite in which a ratio of a saturation magnetization $\sigma s$ to a half-width $\beta$ of a diffraction peak on a (107) plane, $\sigma s/\beta$, is 240 emu $g^{-1}$·$degree^{-1}$ or more, where the half-width $\beta$ is determined by X-ray diffraction analysis.

8. A radio wave absorber comprising:

the magnetic powder for a radio wave absorber according to claim 1.

9. The radio wave absorber according to claim 8, further comprising:

a binder.

10. A radio wave absorbing article comprising:

the radio wave absorber according to claim 8.

11. A radio wave absorbing composition, comprising a magnetic powder for a radio wave absorber, wherein the magnetic powder is a powder of a hexagonal ferrite, having a composition represented by Formula 1:

$$AFe_{(12-x)}Al_xO_{19} \quad \text{(Formula 1)}$$

wherein in Formula 1, A represents one or more kinds of atoms selected from the group consisting of Sr, Ba, Ca, and Pb, and x satisfies $0.10 \leq x \leq 5.00$, and a region B is present on a particle surface of the powder, and the magnetic powder satisfies a relational expression of Expression 2 and Expression 3:

$$0.3 \leq \text{content of } A \text{ atom in region } B/\text{content of Al atom in region } B \leq 23.0, \quad \text{(Expression 2)}$$

$$1.2 \leq \text{total of content of } A \text{ atom and content of Al atom in region } B/\text{total of content of } A \text{ atom and content of Al atom in entire powder} \leq 2.5, \quad \text{(Expression 3)}$$

the content is a content in which a total of an A atom, an Fe atom, and an Al atom is set to 100% by atom, and a unit of the content is % by atom, and the region B is a region that is observed as a bright region having a long side diameter of 0.1 μm or more and 0.6 μm or less in an image subjected to binarization processing, which is obtained by subjecting an image obtained by imaging the particle surface with a scanning electron microscope, to the binarization processing, and wherein the radio wave absorbing composition is a filament for a 3D printer.

12. The radio wave absorbing composition according to claim 11, further comprising:

a binder.

13. A manufacturing method for a magnetic powder for a radio wave absorber, wherein the magnetic powder is a powder of a hexagonal ferrite having a composition represented by Formula 1:

$$AFe_{(12-x)}Al_xO_{19} \quad \text{(Formula 1)}$$

wherein, in Formula 1, A represents one or more kinds of atoms selected from the group consisting of Sr, Ba, Ca, and Pb, and x satisfies $0.10 \leq x \leq 5.00$, and a region B is present on a particle surface of the powder, and the magnetic powder satisfies a relational expression of Expression 2 and Expression 3:

$$0.3 \leq \text{content of } A \text{ atom in region } B/\text{content of Al atom in region } B \leq 23.0, \quad \text{(Expression 2)}$$

$$1.2 \leq \text{total of content of } A \text{ atom and content of Al atom in region } B/\text{total of content of } A \text{ atom and content of Al atom in entire powder} \leq 2.5, \quad \text{(Expression 3)}$$

the content is a content in which a total of an A atom, an Fe atom, and an Al atom is set to 100% by atom, and a unit of the content is % by atom, and the region B is a region that is observed as a bright region having a long side diameter of 0.1 μm or more and 0.6 μm or less in an image subjected to binarization processing, which is obtained by subjecting an image obtained by imaging the particle surface with a scanning electron microscope, to the binarization processing, the manufacturing method comprising:

mixing raw materials of the hexagonal ferrite to obtain a mixture, wherein the raw materials comprise an Fe compound, a compound of the A atom where A is the A atom specified in Formula 1, and an Al compound having an average particle size of 100 μm or less;

adding an adding amount of 3.0% by mass or more of one or more kinds of chlorides selected from the group consisting of strontium chloride, barium chloride, and hydrates thereof, to the mixture with respect to 100% by mass of a total mass of the raw materials; and carrying out sintering after the adding of the chlorides to the mixture.

14. The manufacturing method according to claim 13, wherein the adding amount of the chloride is 5.0% by mass or more and 15.0% by mass or less.

* * * * *